(12) United States Patent
Kreuzer

(10) Patent No.: US 6,680,798 B2
(45) Date of Patent: Jan. 20, 2004

(54) OPTICAL REDUCTION SYSTEM WITH CONTROL OF ILLUMINATION POLARIZATION

(75) Inventor: Justin L. Kreuzer, Trumbull, CT (US)

(73) Assignee: ASML Holding N.V. (NL)

( * ) Notice: Subject to any disclaimer, the term of this patent is extended or adjusted under 35 U.S.C. 154(b) by 126 days.

(21) Appl. No.: 09/841,185

(22) Filed: Apr. 25, 2001

(65) Prior Publication Data

US 2002/0027719 A1 Mar. 7, 2002

Related U.S. Application Data

(60) Provisional application No. 60/199,381, filed on Apr. 25, 2000.

(51) Int. Cl.[7] .................................................. G02B 5/30
(52) U.S. Cl. .................... 359/499; 359/483; 359/494; 359/631; 359/636; 359/639; 359/727
(58) Field of Search ......................... 355/46; 359/499, 359/494, 483, 631, 636, 639, 727

(56) References Cited

U.S. PATENT DOCUMENTS

| | | | |
|---|---|---|---|
| 4,953,960 A | 9/1990 | Williamson | 350/442 |
| 5,537,260 A | 7/1996 | Williamson | 359/727 |
| 5,715,084 A | 2/1998 | Takahashi et al. | 359/487 |

FOREIGN PATENT DOCUMENTS

| | | | |
|---|---|---|---|
| EP | 0 937 999 A1 | 8/1999 | G02B/5/30 |
| JP | 11-054411 | 2/1999 | H01L/21/27 |

OTHER PUBLICATIONS

International Search Report issued Jun. 26, 2002 for Appln. No. PCT/US01/13142, 7 pages.

English–language Abstract of Japanese Patent Publication No. 11–054411, 1 page.

*Primary Examiner*—Audrey Chang
*Assistant Examiner*—Craig Curtis
(74) *Attorney, Agent, or Firm*—Sterne Kessler Goldstein & Fox, PLLC

(57) ABSTRACT

An optical reduction system with polarization dose sensitive output for use in the photolithographic manufacture of semiconductor devices having variable compensation for reticle retardation before the long conjugate end. The variable compensation component(s) before the reticle provides accurate adjustment of the polarization state at or near the reticle. The variable compensation components can be variable wave plates, layered wave plates, opposing mirrors, a Berek's compensator and/or a Soleil-Babinet compensator. The catadioptric optical reduction system provides a relatively high numerical aperture of 0.7 capable of patterning features smaller than 0.25 microns over a 26 mm×5 mm field. The optical reduction system is thereby well adapted to a step and scan microlithographic exposure tool as used in semiconductor manufacturing. Several other embodiments combine elements of different refracting power to widen the spectral bandwidth which can be achieved.

8 Claims, 10 Drawing Sheets

(CONVENTIONAL REDUCTION SYSTEM)

RETICLE BIREFRINGENCE

BEREK'S COMPENSATOR

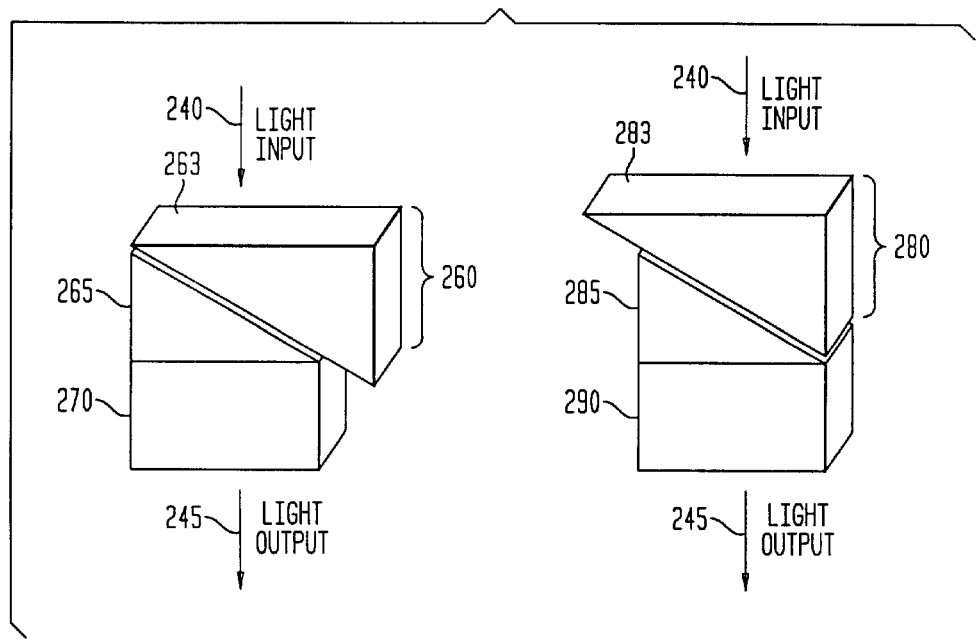

OPTICAL REDUCTION SYSTEM WITH CONTROL OF ILLUMINATION POLARIZATION

CROSS-REFERENCE TO RELATED APPLICATIONS

This application claims benefit under 35 U.S.C. 119(e) from U.S. Provisional Application No. 60/199,381 filed Apr. 25, 2000.

BACKGROUND OF THE INVENTION

1. Field of the Invention

This invention relates generally to optical systems used in semiconductor manufacturing.

2. Related Art

Semiconductor devices are typically manufactured using various photolithographic techniques. The circuitry used in a semiconductor chip is projected from a reticle onto a wafer. This projection is often accomplished with the use of optical systems. The design of these optical systems is often complex, and it is difficult to obtain the desired resolution necessary for reproducing the ever-decreasing size of components being placed on a semiconductor chip. Therefore, there has been much effort expended to develop an optical reduction system capable of reproducing very fine component features, less than 0.25 microns. The need to develop an optical system capable of reproducing very fine component features requires the improvement of system performance.

A conventional optical system is disclosed in U.S. Pat. No. 5,537,260 entitled "Catadioptric Optical Reduction System with High Numerical Aperture" issued Jul. 16, 1996 to Williamson, which is incorporated by reference herein in its entirety. This reference describes an optical reduction system having a numerical aperture of 0.35. Another optical system is described in U.S. Pat. No. 4,953,960 entitled "Optical Reduction System" issuing Sep. 4, 1990 to Williamson, which is incorporated by reference herein in its entirety. This reference describes an optical system operating in the range of 248 nanometers and having a numerical aperture of 0.45.

SUMMARY OF THE INVENTION

While these optical systems perform adequately for their intended purpose, there is an ever increasing need to improve system performance. The present inventor has identified that a need exists for minimizing the effects of reticle birefringence. Further, there is a need for an optical system having low linewidth critical dimension (CD) control errors capable of acceptable system performance.

The introduction of compensation to control illumination polarization limits the performance impact of reticle birefringence on polarization sensitive projection optics including catadioptric projection optic. When the reticle substrate exhibits birefringence there will be a change in the polarization of the light projected through the optical system.

This change alters the performance of the entire system. Characteristics such as reflectivity, insertion loss, and beam splitter ratios will be different for different polarizations. This leads to dose errors at the wafer. Dose errors contribute toward linewidth CD control errors.

Furthermore, even for a perfectly preferred polarization, dose errors can occur from reticle birefringence. This effect will be relatively small, but if the reticle substrate exhibits birefringence and the input light has a small error in it, then the dose errors will be much greater. The present invention minimizes the effect of reticle birefringence by optimizing the illumination by making very small changes to the illumination polarization based on the input light. Dose error is thereby minimized. This minimization results in a reduction in linewidth CD control error.

In one embodiment, a catadioptric optical reduction system has a variable compensation for reticle retardation before the long conjugate end. The variable compensation component(s) before the reticle provides adjustable elliptically polarized light at or near the reticle. The variable compensation components can be variable wave plates, reflective or transmissive thin film polarizers, a Berek's compensator and/or a Soleil-Babinet compensator.

In some applications, the reticle has small amounts, much less than a wavelength, of birefringence. In such applications, the birefringence varies over the reticle. This varying birefringence alters the desired polarization state introducing dose errors and associated CD linewidth variation that are a function of position.

The polarization compensator allows for optimization of the illumination polarization state to minimize the dose errors. These small changes adjust the polarization purity to a better level of perfection in comparison to the few percent polarization purity traditionally required in optical systems.

The polarization state purity is adjusted by making small changes to the actual polarization ellipticity. In general, the compensator can be located at anywhere in the illumination system to change the polarization state at the reticle.

However, if there are any strong polarizers (for example, polarization analyzers), then the compensator should be located in the reticle side of the polarizers.

The catadioptric optical reduction system provides a relatively high numerical aperture of 0.7 capable of patterning features smaller than 0.25 microns over a 26 mm×5 mm field. The optical reduction system is thereby well adapted for photolithographic applications and tools, such as a step and scan microlithographic exposure tool as used in semiconductor manufacturing. Several other embodiments combine elements of different refracting power to widen the spectral bandwidth which can be achieved.

In another embodiment, the present invention is a catadioptric reduction system having, from the object or long conjugate end to the reduced image or short conjugate end, a polarization compensator, a reticle, a first lens group, a second lens group, a beamsplitter cube, a concentric concave mirror, and a third lens group. The concave mirror operates near unit magnification. This reduces the aberrations introduced by the mirror and the diameter of radiation entering the beamsplitter cube. The first and second lens groups before the concave mirror provide enough power to image the entrance pupil at infinity at the aperture stop at or near the concave mirror. The third lens group after the concave mirror provides a substantial portion of the reduction from object to image of the optical system, as well as projecting the aperture stop to an infinite exit pupil. High-order aberrations are reduced by using an aspheric concave mirror.

Further embodiments, features, and advantages of the present invention, as well as the structure and operation of the various embodiments of the present invention, are described in detail below with reference to the accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

In the drawings:

FIG. 2C is an illustration of the properties of a Soleil-Babinet compensator.

Figure 1:
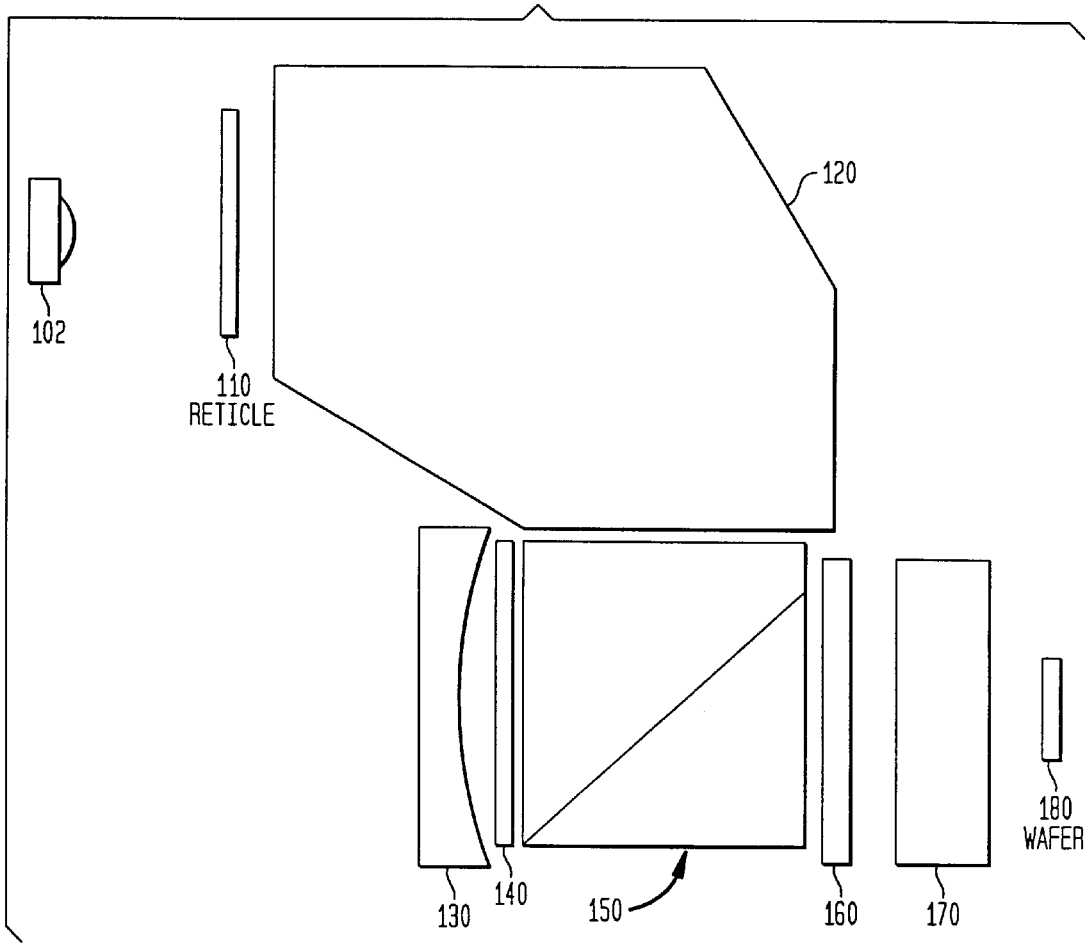
FIG. 1 is a schematic illustration of a conventional optical projection system.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Table of Contents

I. Overview
II. Terminology
III. Conventional Optical System and Reticle Birefringence
IV. Polarization Compensation
V. Example Implementations
  A. Optical System With Control of Laser Illumination Polarization
  B. Alternate Embodiment
  C. Further Embodiments I. Overview The present invention compensates for reticle birefringence. This can improve the imaging quality of catadioptric reduction systems in photolithography. To describe the invention, a terminology section is first provided. An overview section follows that describes an example conventional optical reduction system (FIG. 1) and the problem of reticle birefringence recognized by the present inventor (FIG. 2A). Polarization compensation and optical components for accomplishing polarization compensation according to the present invention are described (FIGS. 2B and 2C). Finally, example implementations of the present invention that have one or more compensators in optical reduction systems to improve imaging quality are discussed (FIGS. 3–9).

II. Terminology

To more clearly delineate the present invention, an effort is made throughout the specification to adhere to the following term definitions as consistently as possible.

The term "circuitry" refers to the features designed for use in a semiconductor device.

The term "dose error" refers to variations in the power distribution of radiation incident on the image or wafer plane.

The term "feature orientation" refers to the patterns printed on a reticle to projection.

The term "long conjugate end" refers to the plane at the object or reticle end of the optical system.

The term "short conjugate end" refers to the plane at the image or wafer end of the optical system.

The term "print bias" refers to the variations in the lines on the wafer produced by asymmetries in the optical system. Asymmetries are produced by diffraction at various stages of the system and the reticle.

The term "semiconductor" refers to a solid state substance that can be electrically altered.

The term "semiconductor chip" refers to a semiconductor device possessing any number of transistors or other components.

The term "wafer" refers to the base material in semiconductor manufacturing, which goes through a series of photomasking, etching and/or implementation steps.

The term "wave plate" refers to retardation plates or phase shifters made from materials which exhibit birefringence.

III. Conventional Optical System and Reticle Birefringence

Figure 2A:
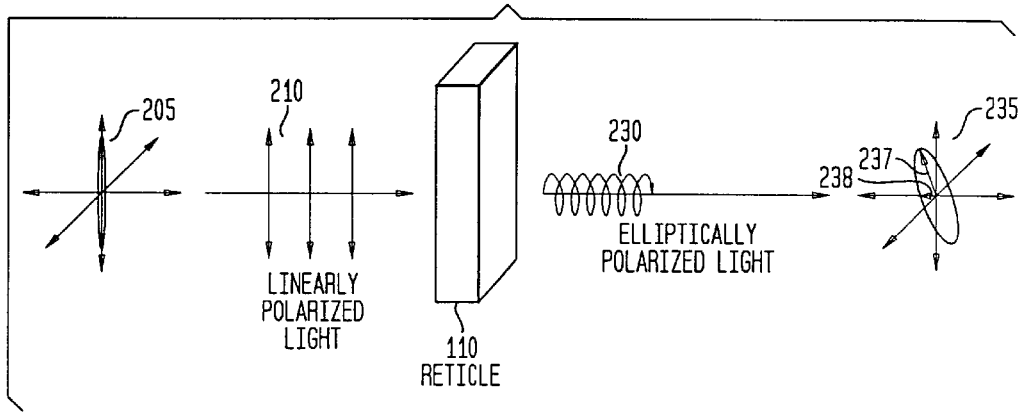
FIG. 2A is an illustration of the birefringent properties of a reticle.
Figure 2B:
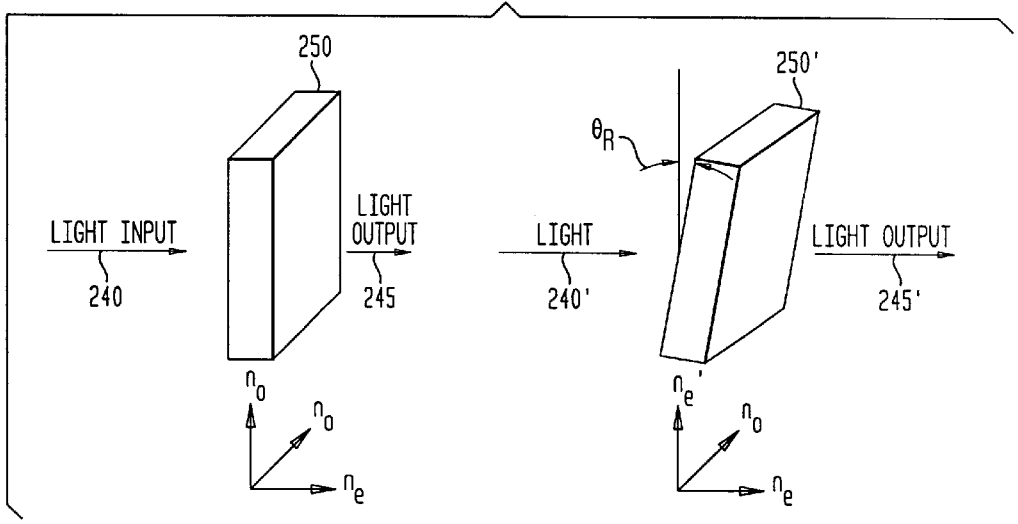
FIG. 2B is an illustration of the properties of a Berek's compensator.

FIG. 1 illustrates a conventional optical reduction system. From its long conjugate end where the reticle is placed to its short conjugate end where the wafer is placed, it possesses a first optical component group 120, a beamsplitter cube 150, a first quarter-wave plate 140, a concave mirror 130, a second quarter-wave plate 160, and a second optical component group 170. Each of these components 120–170 are described further in U.S. Pat. No. 5,537,260 entitled "Catadioptric Optical Reduction System with High Numerical Aperture" issued Jul. 16, 1996 to Williamson (incorporated herein by reference). A feature of any optical system is the interdependence of numerical aperture size and spectral radiation requirements. In order to efficiently illuminate the reticle, linearly polarized light may be desired. In some cases, other illumination polarization states, for example right or left hand circular polarization, may be desired. The limitations of linearly or nearly linearly polarized light are introduced above and discussed in the following sections.

As recognized by the present inventor, most all reticles are weakly birefringent. Thus, reticles alter the linearly polarized light being used to project from the reticle to the wafer. Much as a wave plate, but to a much smaller degree, a reticle can elliptically polarize incident linearly polarized light. This introduces dose errors at the wafer which are magnified at least in part by feature orientations on the reticle. Dose errors contribute to linewidth CD control errors even for a preferred polarization. Linewidth CD control errors are detrimental to the performance of semiconductor devices.

FIG. 2A illustrates the birefringent properties of reticle 110. Reticle 110 is placed in the path of linearly polarized light 210. The vector diagram 205 illustrates the linear state of polarization. Reticle 110 is a weak retarder, that is, it exhibits a small amount of birefringence. After reticle 110, the light is polarized differently, as shown by the curves in light output 230. The vector diagram 235 shows the tip 237 and spread 238 of the light leaving the reticle.

IV. Polarization Compensation

Wave plates (retardation plates or phase shifters) are made from materials which exhibit birefringence. Birefringent materials, including glassy materials under internal or external stress and crystals, are generally anisotropic. This means that the atomic binding forces on the electron clouds are different in different directions and as a result so are the refractive indices.

The simplest class of crystals are those with cubic symmetry. In a cubic crystal, all three crystallographic directions or axes are equivalent. $n_x=n_y=n_z$, and the crystal is optically isotropic. Regardless of how the light is polarized with respect to the crystal, it will experience the same refractive index and hence phase delay. Therefore, any polarized light, aside from accumulating a constant phase delay, remains unchanged after traveling through a defect-free, isotropic crystal. (This is also true for amorphous substances like glass.)

However, another class of crystals exhibits asymmetric (or anisotropic) optical properties. They are known as birefringent crystals. One birefringent type is uniaxial, meaning that one crystal axis is different from the other two: $n_z \neq n_x = n_y$. Common uniaxial crystals of optical quality are quartz, calcite and $MgF_2$. The single crystal axis that is unique is often called the "extraordinary" axis, and its associated refractive index is labeled $n_e$, while the other two axes are "ordinary" axes with index $n_o$.

In the case of uniaxial birefringent crystals such as quartz, a single symmetry axis (actually a direction) known as the optic axis displays two distinct principal indices of refraction: the maximum index $n_o$ (the slow axis) and the minimum index $n_e$ (the fast axis).

According to the terminology of uniaxial crystals, the following labels are used: fast axis and slow axis. Whichever axis has the smallest refractive index is the fast axis. If $n_e < n_o$, as is the case with quartz, then the extraordinary axis is fast and the ordinary axes are slow. Conversely, if $n_e > n_o$, as with calcite and $MgF_2$, then the extraordinary axis is slow, and the ordinary axes are fast. By definition, quartz is said to be a positive uniaxial crystal, whereas calcite is a negative uniaxial crystal. These two indices correspond to light field oscillations parallel and perpendicular to the optic axis.

Input light that is linearly polarized along the crystal's ordinary acts as an ordinary wave and will experience refractive index no. Rotating the crystal so that the light is linearly polarized along the crystal's extraordinary axis causes the light to act as an extraordinary wave which sees a refractive index $n_e$. In these two cases, the phase delays, or optical path length, will be different even though the light travels the same physical path length.

Thus for quartz, the maximum index results in ordinary rays passing through the material along one optical path. The minimum index results in extraordinary rays passing through the material along another optical path. The velocities of the extraordinary and ordinary rays through the birefringent materials vary intensely with their refractive indices. The difference in velocities gives rise to a phase difference when the two beams recombine. In the case of an incident linearly polarized beam this is given by:

$$\alpha = 2\pi d \frac{(n_e - n_o)}{\lambda};$$

where α is the phase difference; d is the thickness of wave plate; $n_e$, $n_o$ are the refractive indices of the extraordinary and ordinary rays respectively, and λ is the wavelength. Thus, at any specific wavelength the phase difference is governed by the thickness of the wave plate.

The thickness of the quarter-wave plate is such that the phase difference is ¼-wavelength (zero order) or some multiple of ¼ wavelength (multiple order). If the angle between the electric field vector of the incident linearly polarized beam and the retarder principal plane of the quarter-wave plate is 45 degrees, the emergent beam is circularly polarized.

Additionally, when a quarter-wave plate is double passed, e.g., when the light passes through it twice because it is reflected off a mirror, it acts as a half-wave plate and rotates the plane of polarization to a certain angle.

By quarter-wave plate is meant a thickness of birefringent material which introduces a quarter of a wavelength of the incident light. This is in contrast to an integral number of half plus quarter-waves or two thicknesses of material whose phase retardance differs by a quarter-wave. The deleterious effects of large angle of incidence variations are thereby minimized at the high numerical aperture by the use of such zero order wave plates, and by restricting the field size in the plane of incidence.

Similarly, the thickness of a half-wave plate is such that the phase difference is ½-wavelength (zero order) or some odd multiple of ½-wavelength (multiple order). A linearly polarized beam incident on a half-wave plate emerges as a linearly polarized beam but rotated such that its angle to the optical axis is twice that of the incident beam.

While variable wave plates can be in several ways, the characteristics of these plates may have detrimental properties similar to those of multiple order discussed above. However, there are techniques available for making zero order wave plates whose retardation can be continuously adjusted. Such a variable wave plate is also called a polarization compensator, and it can be used to achieve any retardation, including quarter-wave and half-wave, for a broad range of wavelengths. Predominantly, there are two types of compensators: the Berek's compensator and the Soleil-Babinet compensator.

The properties of there two compensators are shown in FIGS. 2B and 2C.

FIG. 2B illustrates the properties of a Berek's compensator. FIG. 2C illustrates the properties of a Soleil-Babinet compensator.

The Berek's compensator 250, shown in FIG. 2B, is made from a single plate cut with the extraordinary axis perpendicular to the plate. When light 240 is at normal incidence to the plate, it propagates with a velocity independent of polarization. There is no retardation in output light 245 because the light only experiences a refractive index $n_o$. The light is "ignorant" of the extraordinary axis. But, when the plate 250 is tilted toward or away from the light 240, as shown by plate 250', then one of the axes in the plane of incidence becomes slightly extraordinary. The axis now has an effective refractive index $n'_e$ given by the formula:

$$\frac{1}{n'_e} = \sqrt{\frac{\cos^2\theta_R}{n_o^2} + \frac{\sin^2\theta_R}{n_e^2}}$$

The extraordinary axis is perpendicular to the plate. Tilt causes birefringence and thus phase retardation in output light 245'. Even though the amount of retardation in the Berek's compensator depends on the degree of tilt, it has angular sensitivity equal to a other compensators. The Berek's compensator is attractive because it consists of only one plate of uniaxial crystal, thereby cutting down on the cost and optical loss while still maintaining the versatility of the Soleil-Babinet, discussed below.

The Soleil-Babinet effectively consists of two uniaxial plates stacked together. FIG. 2C shows plates 260 and 270, and 280 and 290. The extraordinary axes of the two plates are perpendicular to each other so the roles of the ordinary and extraordinary axes are reversed as the light travels through one plate and then the other. A phase difference or retardation that is accumulated in plate 260(280) may be partially or completely canceled out by plate 270(290).

A variable compensator is made by designing plate 260 (280) as two complementary wedges, shown as wedge pair 263 and 265 and pair 283 and 285. In this manner, the total effective thickness of plate 260(280) can be adjusted by sliding wedge 263 with respect to wedge 265. This is illustrated in FIG. 2C. When the thickness of plate 260(280) is exactly equal to the thickness of plate 270(290), there is zero net retardation.

Although its operation is easily understood, a Soleil-Babinet compensator can be relatively expensive because it requires three pieces of carefully crafted and mounted uniaxial crystal. Another drawback of the Soleil-Babinet is that it may be quite lossy due to reflections from the six interfaces present in the design.

V. Example Implementations

A. Optical System With Control of Laser Illumination Polarization

The present invention uses variable wave plates to minimize dose errors in a polarization sensitive projection optic system caused by the variation of birefringence over the reticle. As described with respect to the figures, a single polarization compensator provides a single correction for the entire reticle. In one embodiment, multiple complex correctors can provide a correction that varies as a function of reticle position.

In another embodiment, the compensator system can be designed to offset the illumination polarization to compensate for local reticle birefringence.

Figure 3:
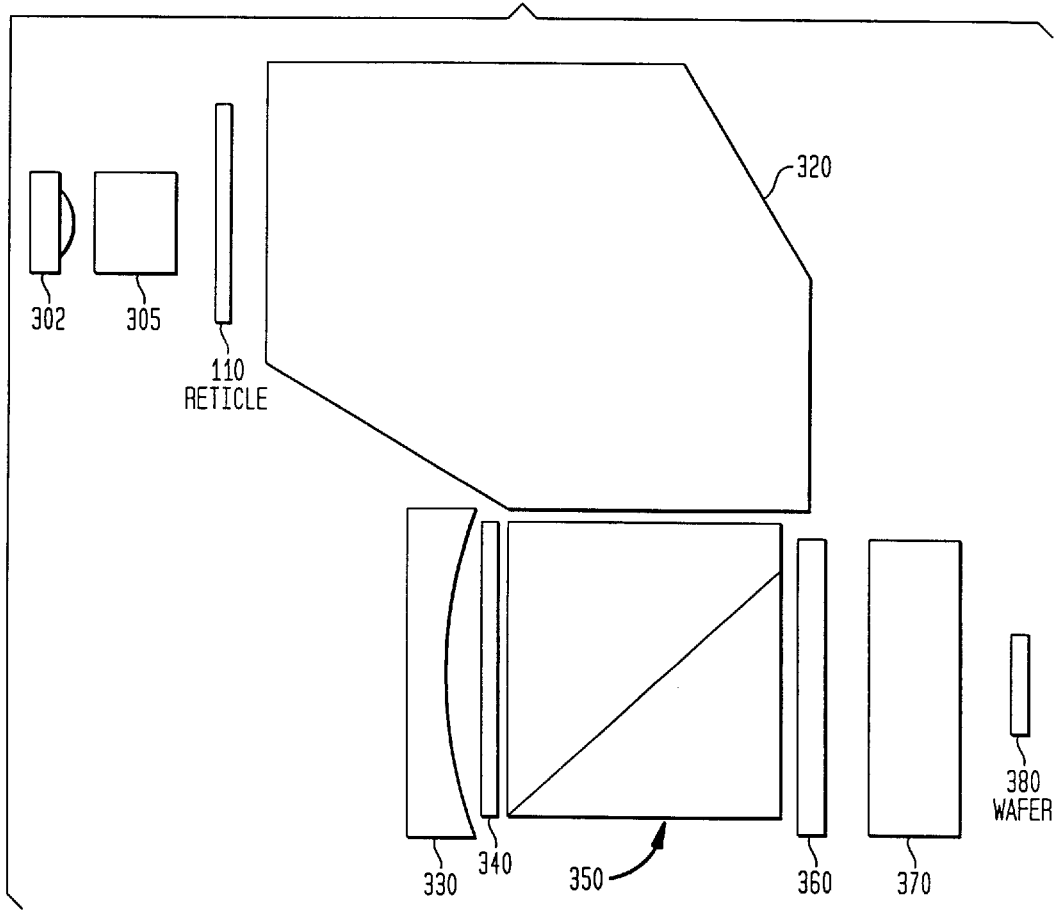
FIG. 3 is a schematic illustration of one embodiment of the present invention using a Berek's compensator.

In one embodiment, for dose control, the polarization state can be evaluated over the exposure. For example, the polarization state can be averaged over the reticle. FIG. 3 illustrates an embodiment of the present invention that eliminates such asymmetries or print biases. A Berek's compensator 305 is introduced before the object or reticle plane 110. Berek's compensator 305 fine-tunes the light in the reticle plane polarization so that it more closely matches the desired state at the reticle plane. In one embodiment, where there is a loss free optical illumination system, the compensator introduces a correction to the polarization that is equal to the polarization error without the compensator. The correction is the departure from the desired state but with the opposite sign. If the projection optic has a small unintended amount of birefringence before any strong polarizers, then the illumination compensator can be offset an additional amount to compensate for this birefringence. Thus, the dose errors caused by the birefringence of the reticle are minimized and linewidth CD control improved.

B. Alternate Embodiment

Figure 4:
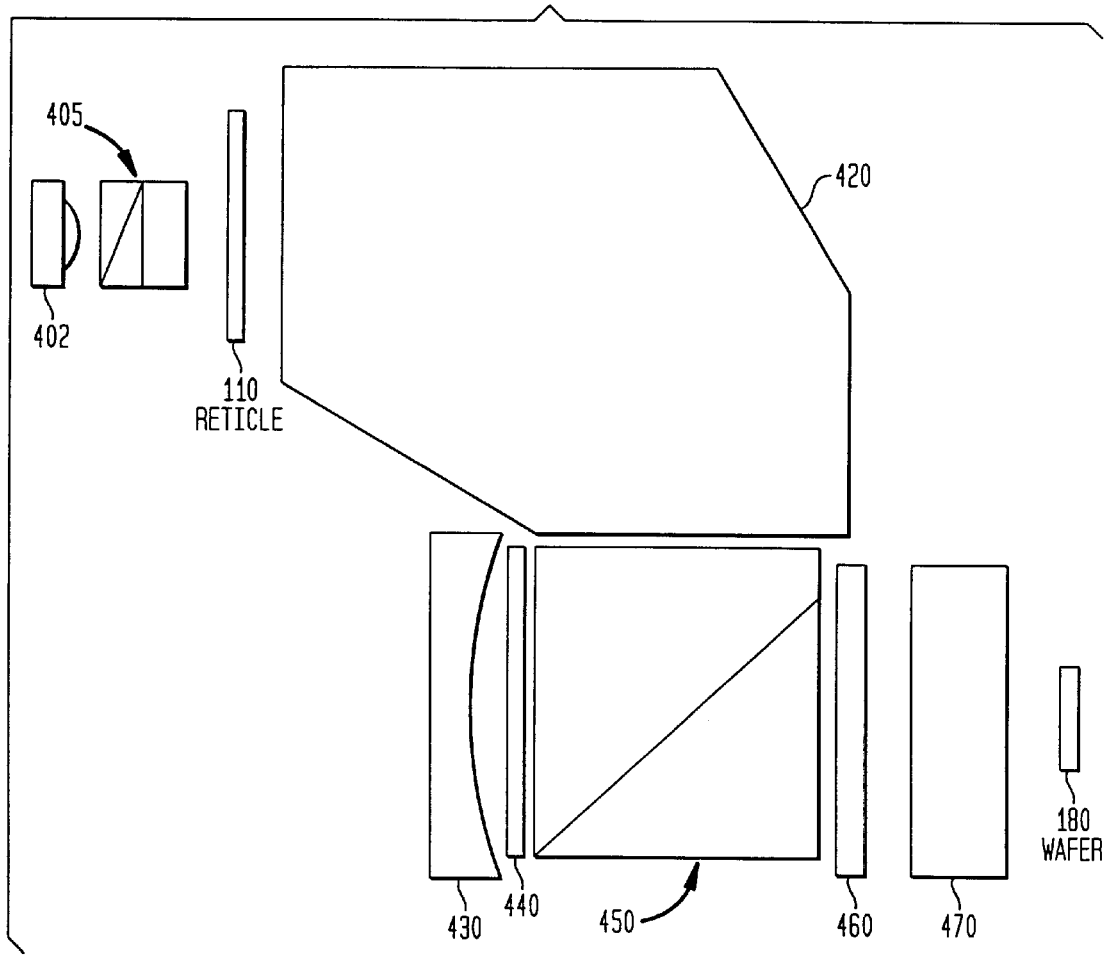
FIG. 4 is a schematic illustration of one embodiment of the present invention using a Soleil-Babinet compensator.

It is also apparent to one skilled in the relevant art that a Soleil-Babinet compensator 405 could be inserted into the system before reticle 110 in place of Berek's compensator 305. This embodiment is shown in FIG. 4 where Soleil-Babinet compensator 405 serves the same function as Berek's compensator 305 and performs within the same general characteristics, as discussed above.

C. Further Embodiments

The present invention can be implemented in various projection optic systems. For example, the present invention can be implemented in catadioptric systems as described in detail herein, as well as refractive and reflective systems. On skilled in the relevant art, based at least on the teachings provided herein, would recognize that the embodiments of the present invention are applicable to other reduction systems. More detailed embodiments of the present invention as provided below.

Additional embodiments having variable wave plates 505, 605, 705, 805, and 905 are described in detail below with respect to FIGS. 5–9. Variable wave plates 505, 605, 705, 805, and 905 are not limited to variable wave plates and in general can be any type of variable compensator including but not limited to, layered wave plates, opposing mirrors, Berek's compensators and/or Soleil-Babinet compensators.

Figure 5:
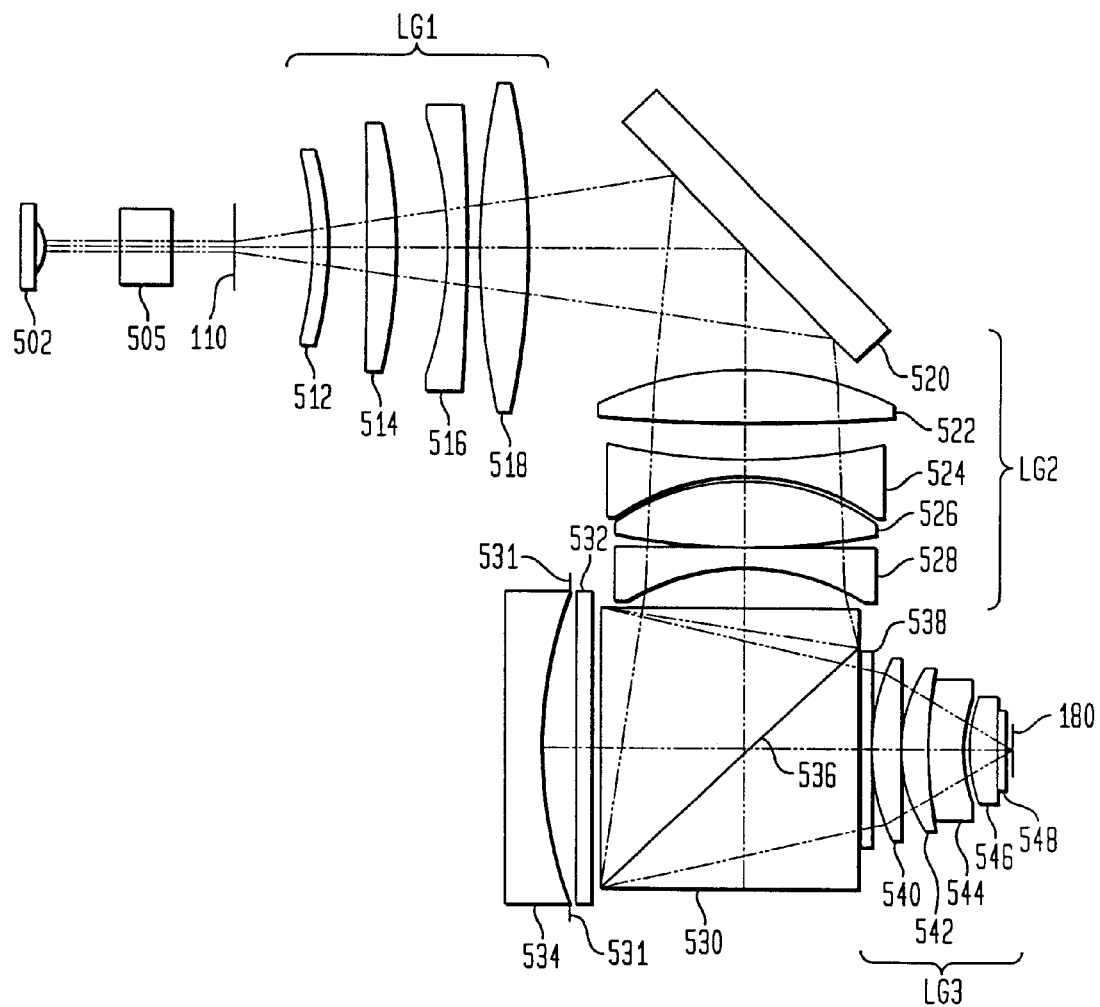
FIG. 5 is a schematic illustration of a further embodiment of the present invention using a single refracting material.

FIG. 5 illustrates another embodiment of the optical reduction system of the present invention that includes a variable wave plate 505 within the illumination system to provide compensation for reticle birefringence. From its long conjugate end, it comprises a variable wave plate 505, an object or reticle plane 110, a first lens group LG1, a folding mirror 520, a second lens group LG2, a beamsplitter cube 530, a first quarter-wave plate 532, a concave mirror 534, a second quarter-wave plate 538, and a third lens group LG3. The image is formed at image or wafer plane 180. The first lens group LG1 comprises a shell 512, a spaced doublet including positive lens 514 and negative lens 516, and positive lens 518. The shell 512 is an almost zero power or zero power lens. The second lens group LG2 comprises a positive lens 522, a spaced doublet including a negative lens 524 and a positive lens 526, and negative lens 528. The third lens group LG3 comprises two positive lenses 540 and 542, which are strongly positive, shell 544, and two positive lenses 546 and 548, which are weakly positive. The folding mirror 520 is not essential to the operation of the present invention. However, the folding mirror permits the object and image planes to be parallel which is convenient for one intended application of the optical system of the present invention, which is the manufacture of semiconductor devices using photolithography with a step and scan system.

Radiation enters the system at the long conjugate end and passes through the first lens group LG1, is reflected by the folding mirror 520, and passes through the second lens group LG2. The radiation enters the beamsplitter cube 530 and is reflected from surface 536 passing through quarter-wave plate 532 and reflected by concave mirror 534. The radiation then passes back through the quarter-wave plate 532, the beamsplitter cube 530, the quarter-wave plate 538, lens group LG3, and is focused at the image or wafer plane 180.

Lens groups upstream of the mirror, LG1 and LG2, provide only enough power to image the entrance pupil at infinity to the aperture stop 531 at or near the concave mirror 534. The combined power of lens groups LG1 and LG2 is slightly negative. The shell 512 and air spaced doublet 514 and 516 assist in aberration corrections including astigmatism, field curvature, and distortion. The lens group LG3, after the concave mirror 534, provides most of the reduction from object to image size, as well as projecting the aperture stop to an infinite exit pupil. The two strongly positive lenses 540 and 542 provide a high numerical aperture at the image and exit pupils and infinity. The shell 544 has almost no power. The two weakly positive lenses 546 and 548 help correct high order aberrations. The concave mirror 534 may provide a reduction ratio of between 1.6 and 2.7 times that of the total system.

The negative lens 524 in the second lens group LG2 provides a strongly diverging beam directed at the beamsplitter cube 530 and concave mirror 534. The strongly positive lens 522 provides lateral color correction. The air space doublet comprising lenses 524 and 526 helps to correct spherical aberrations and coma. Concave mirror 534 is preferably aspheric, therefore helping further reduce high order aberrations.

The transmission losses introduced by the beamsplitter cube 530 are minimized by illuminating the object or reticle with linearly polarized light and including a quarter-wave plate 532 between the beamsplitter cube 530 and the concave mirror 534. Additionally, by increasing the numerical aperture in lens group LG3, after the concave mirror 534 and beamsplitter cube 530, the greatest angular range is not seen in these elements.

However, the use of linearly polarized light at numerical apertures greater than about 0.5 introduces small but noticeable asymmetries in the imaging. In the present invention, this can effectively be removed by introducing another quarter-wave plate 538 after the final passage through the beamsplitter cube 530, thereby converting the linearly polarized light into circularly polarized light. This circularly polarized light is basically indistinguishable from unpolarized light in its imaging behavior.

The optical system illustrated in FIG. 5 is designed to operate at a reduction ratio of 4 to 1. Therefore, the numerical aperture in the image space is reduced from 0.7 by a factor of 4 to 0.175 at the object or reticle plane 110. In other words, the object space numerical aperture is 0.175 and the image space numerical aperture is 0.7. Upon leaving the first lens group LG1 the numerical aperture is reduced to 0.12, a consequence of the positive power needed in lens group LG1 to image the entrance pupil at infinity to the aperture stop of the system close to the concave mirror 534. The numerical aperture after leaving the second lens group LG2 and entering the beamsplitter is 0.19. Therefore, the emerging numerical aperture from the second lens group LG2, which is 0.19, is larger than the entering or object space numerical aperture of lens group LG1, which is 0.175. In other words, the second lens group LG2 has an emerging numerical aperture greater than the entering numerical aperture of the first lens group LG1. This is very similar to the object space numerical aperture, which is 0.175, due to the overall negative power of the second lens group LG2. This is contrary to prior art systems where the numerical aperture entering a beamsplitter cube is typically close to zero or almost collimated. The concave mirror 534 being almost concentric, the numerical aperture of the radiation reflected from it is increased only slightly from 0.19 to 0.35. The third lens group LG3 effectively doubles the numerical aperture to its final value of 0.7 at the wafer or image plane 180.

The present invention achieves its relatively high numerical aperture without obstruction by the edges of the beamsplitter cube by means of the negative second group LG2 and the strongly positive third lens group LG3. The use of the beamsplitter cube 530 rather than a plate beamsplitter is important in the present invention because at numerical apertures greater than about 0.45 a beamsplitter cube will provide better performance. There is a reduction of the numerical aperture within the cube by the refractive index of the glass, as well as the absence of aberrations that would be introduced by a tilted plate beamsplitter in the non-collimated beam entering the beamsplitter. The construction data for the lens system illustrated in FIG. 5 according to the present invention is given in Table 1 below.

TABLE 1

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 505 | Infinite | Infinite | 33.1000 | 123.0000 | 123.0000 | Quartz |
| Space | | | 0.7500 | | | |
| 110 | Infinite | | 63.3853 | | | |
| Space | | | 0.7500 | | | |
| 512 | −158.7745 | −177.8880 | 15.0000 | 124.0478 | 131.7725 | Silica |
| Space | | | 36.1130 | | | |
| 514 | −556.6911 | −202.0072 | 22.2126 | 148.3881 | 152.5669 | Silica |
| Space | | | 38.7188 | | | |
| 516 | −183.7199 | −558.8803 | 15.0000 | 156.5546 | 166.5750 | Silica |
| Space | | | 10.0674 | | | |
| 518 | 427.2527 | −612.2450 | 28.8010 | 177.4010 | 179.0292 | Silica |
| Space | | | 132.3320 | | | |
| 520 | Infinite | | −74.0000 | 184.6402 | | Reflection |
| 522 | −240.4810 | 2050.9592 | −33.3135 | 188.4055 | 185.3395 | Silica |
| Space | | | −29.3434 | | | |
| 524 | 421.7829 | −145.6176 | −12.0000 | 175.5823 | 169.0234 | Silica |
| Space | | | −4.2326 | | | |
| 526 | −150.4759 | 472.0653 | −46.5091 | 171.4244 | 169.9587 | Silica |
| Space | | | −2.0000 | | | |
| 528 | −1472.2790 | −138.2223 | −15.0000 | 165.3586 | 154.8084 | Silica |
| Space | | | −27.2060 | | | |
| 530 | Infinite | Infinite | −91.8186 | 155.6662 | 253.0917 | Silica |
| 536 | Infinite | | | 253.0917 | | Reflection |
| 530 | Infinite | Infinite | 91.8186 | 253.0917 | 253.0917 | Silica |
| Space | | | 2.0000 | | | |
| 532 | Infinite | Infinite | 6.0000 | 185.8693 | 186.8401 | Silica |
| Space | | | 17.9918 | | | |
| Stop | | | | 188.0655 | | |
| 534 | Aspheric | | −17.9918 | 188.0655 | | Reflection |
| 532 | Infinite | Infinite | −6.0000 | 183.5471 | 180.1419 | Silica |
| Space | | | −2.0000 | | | |
| 530 | Infinite | Infinite | −91.8186 | 178.3346 | 149.2832 | Silica |
| 530 | Infinite | Infinite | −70.000 | 149.2832 | 128.8604 | Silica |
| Space | | | −2.0000 | | | |
| 538 | Infinite | Infinite | −4.500 | 127.9681 | 126.6552 | Silica |
| Space | | | −0.7500 | | | |
| 540 | −175.1330 | 1737.4442 | −17.7754 | 121.4715 | 118.2689 | Silica |

TABLE 1-continued

| Element Number | Radius of Curvature (mm) Front | Back | Thickness (mm) | Aperture Diameter (mm) Front | Back | Glass |
|---|---|---|---|---|---|---|
| Space | | | −0.7500 | | | |
| 542 | −108.8178 | −580.1370 | −18.2407 | 104.5228 | 97.7967 | Silica |
| Space | | | −0.7500 | | | |
| 544 | −202.2637 | −86.6025 | −31.1216 | 91.7061 | 57.4968 | Silica |
| Space | | | −2.3507 | | | |
| 546 | −122.1235 | −488.7122 | −17.9476 | 56.4818 | 41.1675 | Silica |
| Space | | | −0.2000 | | | |
| 548 | −160.8506 | −360.1907 | −6.1500 | 39.4528 | 33.5764 | Silica |
| Space | | | −4.000 | | | |
| 180 | Infinite | | | 26.5019 | | |

Concave mirror 534 has an aspheric reflective surface according to the following equation:

$$Z = \frac{(CURV)Y^2}{1+\sqrt{1-(1+k)(CURV)^2 Y^2}} + (A)Y^4 + (B)Y^6 + (D)Y^{10} + (E)Y^{12} + (F)Y^{14};$$

wherein the constants are as follows:
CURV=−0.00289051
K=0.000000
A=6.08975×10$^{-11}$
B=2.64378×10$^{14}$
C=9.82237×10$^{-19}$
D=7.98056×10$^{-23}$
E=−5.96805×10$^{-27}$
F=4.85179×10$^{-31}$ The lens according to the construction in Table 1 is optimized for radiation centered on 248.4 nanometers. The single refracting material of fused silica and the large portion of refracting power restricts the spectral bandwidth of the embodiment illustrated in FIG. 5 to about 10 picometers or 0.01 nanometers. This spectral bandwidth is more than adequate for a line narrowed krypton fluoride excimer laser light source. The embodiment illustrated in FIG. 5 can be optimized for any wavelength for which fused silica transmits adequately.

Figure 6:
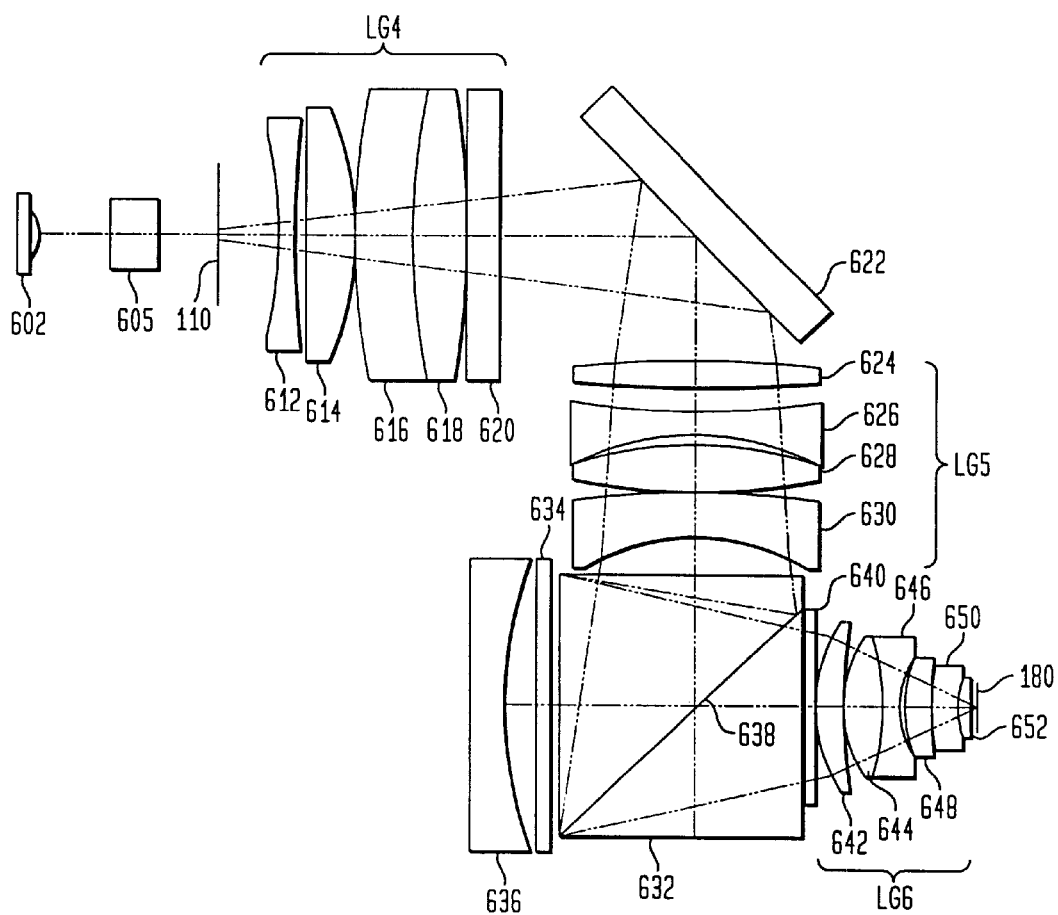
FIG. 6 is another embodiment of the present invention using two different refracting materials.

A wider spectral bandwidth can be achieved by the use of two optical materials with different dispersions. A second embodiment of the present invention is illustrated in FIG. 6. From its long conjugate end, it comprises a first quarter-wave plate 608, an object or reticle plane 110, a second quarter-wave plate 611, a lens group LG4, a folding mirror 622, a lens group LG5, a beamsplitter cube 632 having surface 638, a first quarter-wave plate 634, a concave mirror 636, a second quarter-wave plate 640, and lens group LG6. The image is formed at image or wafer plane 180. The lens group LG4 comprises a spaced doublet including negative lens 612 and positive lens 614, a weak positive lens 616, positive lens 618, and shell 620. The lens group LG5 comprises a positive lens 624, a negative lens 626, a positive lens 628, and a negative lens 630. The lens group LG6 comprises two positive lenses 642, cemented doublet including positive lens 644 and negative lens 646, positive lens 648, and cemented doublet including shell 650 and positive lens 652.

This second embodiment uses calcium fluoride in one of the individual positive lenses of the lens group LG4, negative lenses of the lens group LG5, and two of the positive lenses of the lens group LG6. The construction data of the second embodiment illustrated in FIG. 6 of the present invention is given in Table 2 below.

TABLE 2

| Element Number | Radius of Curvature (mm) Front | Back | Thickness (mm) | Aperture Diameter (mm) Front | Back | Glass |
|---|---|---|---|---|---|---|
| 605 | Infinite | Infinite | 33.1000 | 123.0000 | 123.0000 | Quartz |
| Space | | | 0.5000 | | | |
| 110 | Infinite | | 60.4852 | | | |
| Space | | | 0.5000 | | | |
| 612 | −205.5158 | 539.1791 | 15.2158 | 124.0926 | 137.3346 | Silica |
| Space | | | 8.8054 | | | |
| 614 | 2080.9700 | −210.6539 | 32.4984 | 142.6149 | 151.7878 | Silica |
| Space | | | 1.2676 | | | |
| 616 | 310.4463 | 700.3748 | 40.7304 | 162.4908 | 165.2126 | CaFl |
| Space | | | 0.5000 | | | |
| 618 | 634.1820 | −798.8523 | 27.5892 | 165.4595 | 166.4747 | Silica |
| Space | | | 0.5000 | | | |
| 620 | 1480.0597 | 1312.1247 | 25.4322 | 168.7516 | 164.7651 | Silica |
| Space | | | 136.2343 | | | |
| 622 | Infinite | | −74.0000 | 161.9590 | | Reflection |
| 624 | −761.9176 | 1088.9351 | −19.2150 | 160.3165 | 159.2384 | Silica |

TABLE 2-continued

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| Space | | | −19.9465 | | | |
| 626 | 648.8361 | −202.5872 | −12.0000 | 155.1711 | 153.0635 | CaFl |
| Space | | | −7.6304 | | | |
| 628 | −400.4276 | 458.5060 | −25.8769 | 153.0635 | 153.8055 | Silica |
| Space | | | −2.0000 | | | |
| 630 | −818.0922 | −168.5034 | −27.5927 | 152.6663 | 147.5200 | CaFl |
| Space | | | −20.5014 | | | |
| 632 | Infinite | Infinite | −91.7553 | 148.6158 | 252.7349 | Silica |
| 638 | Infinite | | | | 252.7349 | Reflection |
| 632 | Infinite | Infinite | 91.7553 | 252.7349 | 252.7349 | Silica |
| Space | | | 2.0000 | | | |
| 634 | Infinite | Infinite | 6.0000 | 185.8070 | 187.0026 | Silica |
| Space | | | 18.1636 | | | |
| Stop | | | | | 188.5681 | |
| 636 | Aspheric | | −18.1636 | | 188.5681 | Reflection |
| 634 | Infinite | Infinite | −6.0000 | 184.2566 | 181.1084 | Silica |
| Space | | | −2.0000 | | | |
| 632 | Infinite | Infinite | −91.7553 | 179.3838 | 151.7747 | Silica |
| 632 | Infinite | Infinite | −70.0000 | 151.7747 | 133.3985 | Silica |
| Space | | | −2.0000 | | | |
| 640 | Infinite | Infinite | −4.5000 | 132.5690 | 131.3876 | Silica |
| Space | | | −0.5000 | | | |
| 642 | −112.0665 | −597.6805 | −21.4866 | 123.4895 | 119.2442 | Silica |
| Space | | | −0.5000 | | | |
| 644 | −116.3137 | 282.3140 | −24.0940 | 107.8451 | 101.2412 | CaFl |
| 646 | 282.3140 | −66.5293 | −13.7306 | 101.2412 | 72.6862 | Silica |
| Space | | | −2.6346 | | | |
| 648 | −77.2627 | −374.4800 | −17.9594 | 72.0749 | 62.7659 | Silica |
| Space | | | −0.5452 | | | |
| 650 | −130.1381 | −57.1295 | −20.8147 | 58.9696 | 37.4889 | Silica |
| 652 | −57.1295 | −7305.8777 | −6.1425 | 37.4889 | 34.3156 | CaFl |
| Space | | | −4.0000 | | | |
| 180 | Infinite | | | | 26.4992 | | wherein the constants for the aspheric mirror 634 used in the equation after Table 1 are as follows:

CURV=−0.00286744
K=0.000000
A=−1.92013×10$^{-09}$
B=−3.50840×10$^{-14}$
C=2.95934×10$^{-19}$
D=−1.10495×10$^{-22}$
E=9.03439×10$^{-27}$
F=−1.39494×10$^{-31}$

This second embodiment is optimized for radiation centered on 193.3 nanometers and has a spectral bandwidth of about 200 picometers or 0.2 nanometers. A slightly line narrowed argon fluoride excimer laser is an adequate light source. Additionally, the design can be optimized for any wavelength for which both refractive materials transmit adequately. The bandwidth will generally increase for longer wavelengths, as the material dispersions decrease. For example, around 248.4 nanometers such a two-material design will operate over at least a 400 picometers, 0.4 nanometers bandwidth.

At wavelengths longer than 360 nanometers, a wider range of optical glasses begin to have adequate transmission. A third embodiment illustrated in FIG. 7 takes advantage of this wider selection of glasses and further reduced dispersion. From its long conjugate end, it comprises an object or reticle plane 110, a lens group LG7, a folding mirror 722, a lens group LG8, a beamsplitter cube 732 having a surface 738, a first quarter-wave plate 734, a concave mirror 736, a second quarter-wave plate 740, and lens group LG9. The image is formed at image or wafer plane 180. The lens group LG7 comprises a spaced doublet comprising negative lens 712 and positive lens 714, spaced doublet including positive lens 716 and negative lens 718, and positive lens 720. The lens group LG8 comprises a positive lens 724, a negative lens 726, a positive lens 728, and a negative lens 730. The lens group LG9 comprises a positive lenses 742, cemented doublet including positive lens 744 and negative lens 746, positive lens 748, and cemented doublet including shell 750 and positive lens 752.

Figure 7:
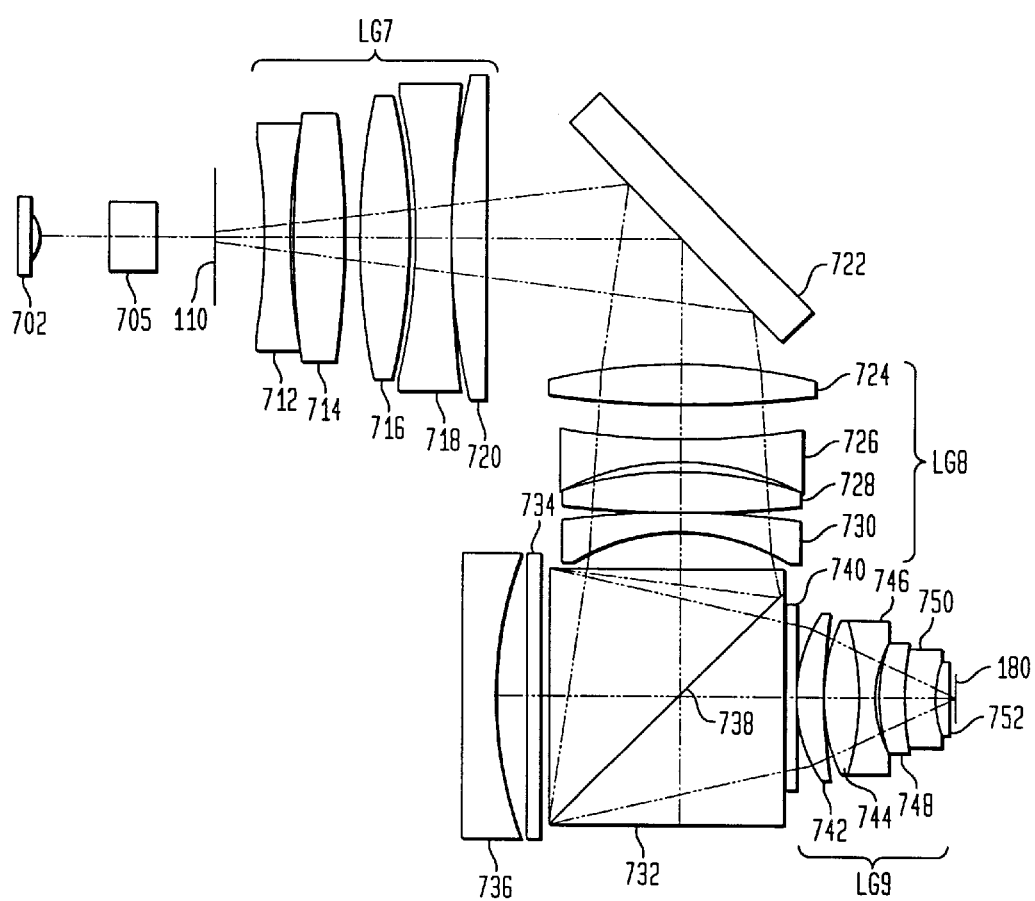
FIG. 7 is another embodiment of the present invention using more than two different refracting materials.

The construction data of the third embodiment illustrated in FIG. 7 is given in Table 3 below.

TABLE 3

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 705 | Infinite | Infinite | 33.1000 | 123.0000 | 123.0000 | Quartz |
| Space | | | 0.5000 | | | |

TABLE 3-continued

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 110 | Infinite | | 59.2960 | | | |
| Space | | | 0.5000 | | | |
| 712 | −620.7809 | 361.8305 | 20.2974 | 125.9406 | 134.7227 | PBM2Y |
| Space | | | 2.6174 | | | |
| 714 | 515.7935 | −455.1015 | 39.8858 | 135.3384 | 145.6015 | PBM2Y |
| Space | | | 14.7197 | | | |
| 716 | 431.3189 | −239.4002 | 36.9329 | 155.6269 | 157.3014 | BSL7Y |
| Space | | | 0.5000 | | | |
| 718 | −259.6013 | 685.3286 | 26.3534 | 156.9363 | 162.2451 | PBM2Y |
| Space | | | 1.4303 | | | |
| 720 | 361.5709 | −1853.2955 | 23.3934 | 168.7516 | 165.1801 | BAL15Y |
| Space | | | 131.8538 | | | |
| 722 | Infinite | | −77.8469 | 169.9390 | | Reflection |
| 724 | −429.2950 | 455.4247 | −32.3086 | 173.0235 | 171.1102 | PBL6Y |
| Space | | | −27.6206 | | | |
| 726 | 401.0363 | −180.0031 | −12.0000 | 159.3555 | 154.7155 | BSL7Y |
| Space | | | −5.6227 | | | |
| 728 | −258.4722 | 1301.3764 | −26.1321 | 154.7155 | 154.1517 | PBM8Y |
| Space | | | −2.0000 | | | |
| 730 | −1282.8931 | −180.2226 | −12.0000 | 153.1461 | 149.4794 | BSL7Y |
| Space | | | −19.7282 | | | |
| 732 | Infinite | Infinite | −91.7349 | 150.4585 | 252.6772 | Silica |
| 738 | Infinite | | | 252.6772 | | Reflection |
| 732 | Infinite | Infinite | 91.7349 | 252.6772 | 252.6772 | Silica |
| Space | | | 2.0000 | | | |
| 734 | Infinite | Infinite | 6.0000 | 185.6435 | 186.7758 | Silica |
| Space | | | 18.2715 | | | |
| Stop | | | | 188.1745 | | |
| 736 | Aspheric | | −18.2715 | 188.1745 | | Reflection |
| 734 | Infinite | Infinite | −6.0000 | 183.6393 | 180.1377 | Silica |
| Space | | | −2.0000 | | | |
| 732 | Infinite | Infinite | −91.7349 | 178.3236 | 147.9888 | Silica |
| 732 | Infinite | Infinite | −70.0000 | 147.9888 | 126.9282 | Silica |
| Space | | | −2.000 | | | |
| 740 | Infinite | Infinite | −4.5000 | 126.0289 | 124.6750 | Silica |
| Space | | | −0.5000 | | | |
| 742 | −119.8912 | −610.6840 | −18.6508 | 117.5305 | 113.4233 | BSM51Y |
| Space | | | −0.5000 | | | |
| 744 | −114.1327 | 384.9135 | −21.1139 | 102.6172 | 96.4137 | BSL7Y |
| 746 | 384.9135 | −70.2077 | −13.0576 | 96.4137 | 71.1691 | PBL26Y |
| Space | | | −2.8552 | | | |
| 748 | −85.7858 | −400.3240 | −16.9147 | 70.5182 | 61.2633 | BSM51Y |
| Space | | | −0.8180 | | | |
| 750 | −151.5235 | −54.0114 | −19.5810 | 57.6234 | 37.3909 | BSM51Y |
| 752 | −54.0114 | −2011.1057 | −6.3947 | 37.3909 | 34.2119 | PBL6Y |
| Space | | | −4.0000 | | | |
| 180 | Infinite | | | 26.5002 | | | wherein the constants for the aspheric mirror 736 used in the equation after Table 1 as follows:

CURV=−0.00291648
K=0.000000
A=−1.27285×10$^{-9}$
B=−1.92865×10$^{-14}$
C=6.21813×10$^{-19}$
D=−6.80975×10$^{23}$
E=6.04233×10$^{-27}$
F=3.64479×10$^{-32}$

This third embodiment operates over a spectral bandwidth of 8 nanometers centered on 365.5 nanometers. A radiation of this spectral bandwidth can be provided by a filtered mercury arc lamp at the I-line waveband. The optical glasses other than fused silica used in this third embodiment are commonly known as I-line glasses. These optical glasses have the least absorption or solarization effects at the mercury I-line wavelength.

Figure 8:
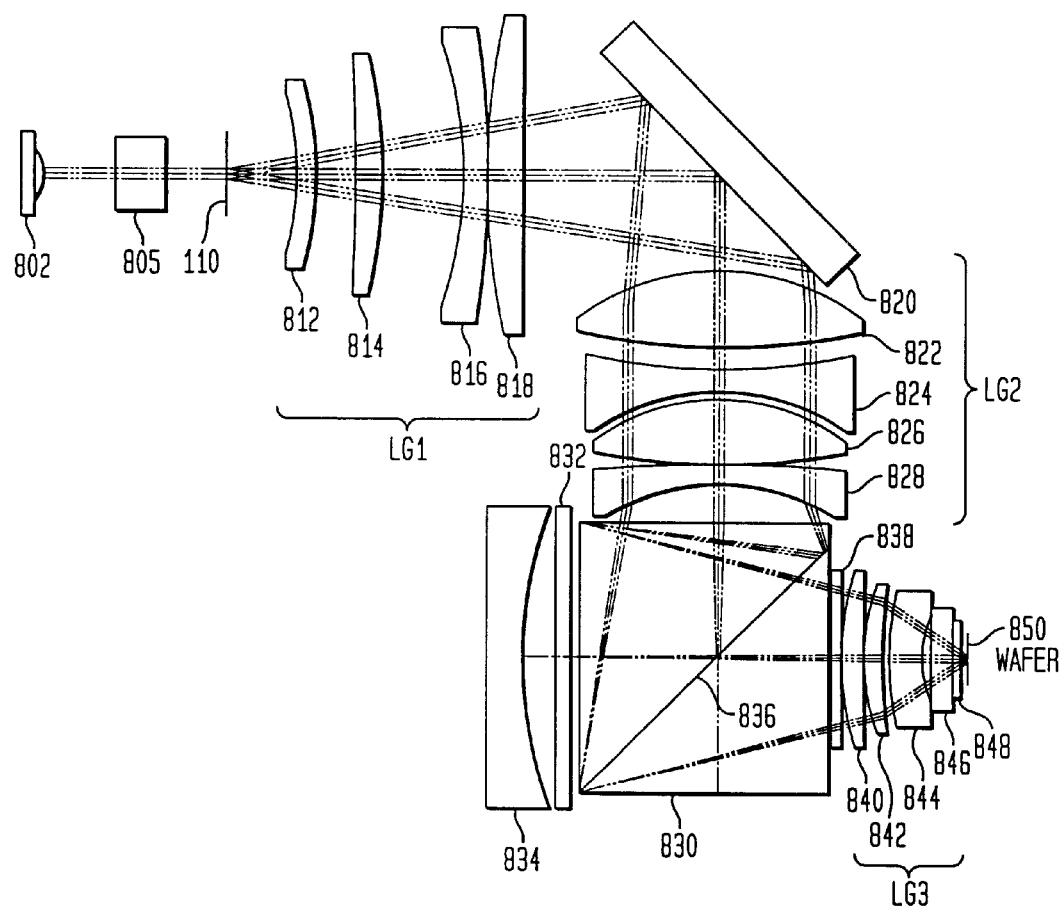
FIG. 8 is another embodiment of the present invention.

FIG. 8 illustrates a fourth embodiment of the optical reduction system of the present invention. This embodiment has a numerical aperture of 0.63 and can operate at a spectral bandwidth of 300 picometers, and preferably of 100 picometers, centered on 248.4 nanometers. From the long conjugate end, it includes an object or reticle plane 110, a first lens group LG1, a folding mirror 820, a second lens group LG2, a beamsplitter cube 830, a first quarter-wave plate 832, a concave mirror 834, a second quarter-wave plate 838, and a third lens group LG3. The image is formed at the image or wafer plane 180.

The first lens group LG1 comprises a shell 812, a spaced doublet including a positive lens 814 and a negative lens 816, and a positive lens 818. The second lens group LG2 comprises a positive lens 822, a spaced doublet including a negative lens 824 and a positive lens 826, and a negative lens 828. The third lens group LG3 comprises two positive lenses 840 and 842, a shell 844, and two positive lenses 846 and 848. Again, as in the embodiment illustrated in FIG. 5, the folding mirror 820 of FIG. 8 is not essential to the operation of the invention, but nevertheless permits the object 110 and image plane 180 to be parallel to each other which is convenient for the manufacture of semiconductor devices using photolithography.

The construction data of the fourth embodiment illustrated in FIG. 8 is given in Table 4 below.

TABLE 4

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 805 | Infinite | Infinite | 33.1000 | 123.0000 | 123.0000 | Quartz |
| Space | | | 2.0000 | | | |
| 110 | Infinite | | 63.3853 | | | |
| Space | | | 2.0000 | | | |
| 812 | −183.5661 | −215.7867CX | 17.0000 | 122.8436 | 130.6579 | Silica |
| Space | | | 46.6205 | | | |
| 814 | −601.1535CC | −230.9702CX | 21.4839 | 149.1476 | 153.3103 | Silica |
| Space | | | 68.8075 | | | |
| 816 | −191.1255 | −345.4510CX | 15.0000 | 161.6789 | 170.1025 | Silica |
| Space | | | 3.0000 | | | |
| 818 | 435.8058CX | −1045.1785CX | 24.9351 | 177.4250 | 178.2672 | Silica |
| Space | | Decenter(1) | 130.0000 | | | |
| 820 | Infinite | | −64.5000 | 180.3457 | | Reflection |
| 822 | −210.7910CX | 380.1625CX | −43.1418 | 181.6672 | 178.0170 | Silica |
| Space | | | −15.8065 | | | |
| 824 | 300.1724CC | −123.4555CC | −12.0000 | 166.7278 | 152.3101 | Silica |
| Space | | | −3.8871 | | | |
| 826 | −126.8915CX | 972.6391CX | −41.3263 | 154.8530 | 151.8327 | Silica |
| Space | | | −1.5000 | | | |
| 828 | −626.4905CX | −116.6456CC | −12.0000 | 147.6711 | 136.1163 | Silica |
| Space | | | −31.8384 | | | |
| 830 | Infinite | Infinite Decenter(2) | −74.0000 | 137.2448 | 200.1127 | Silica |
| 836 | Infinite | | | 200.1128 | | Reflection |
| 830 | Infinite | Infinite | 74.0000 | 200.1127 | 200.1127 | Silica |
| Space | | | 2.0000 | | | |
| 832 | Infinite | Infinite | 6.0000 | 148.6188 | 149.0707 | Silica |
| Space | | | 14.4638 | | | |
| Stop | | | | 149.6392 | | |
| 834 | Aspheric | | −14.4638 | 149.6392 | | Reflection |
| 832 | Infinite | Infinite | −6.0000 | 144.8563 | 141.2737 | Silica |
| Space | | | −2.0000 | | | |
| 830 | Infinite | Infinite Decenter(3) | −74.000 | 139.3606 | 117.3979 | Silica |
| 830 | Infinite | Infinite | −61.000 | 117.3979 | 100.5074 | Silica |
| Space | | | −2.0000 | | | |
| 838 | Infinite | Infinite | −4.5000 | 99.6617 | 98.4157 | Silica |
| Space | | | −1.2000 | | | |
| 840 | −157.8776CX | 2282.2178CX | −13.7501 | 94.8267 | 91.8775 | Silica |
| Space | | | −1.2000 | | | |
| 842 | −94.0059CX | −46.6659CC | −13.4850 | 82.8663 | 78.1418 | Silica |
| Space | | | −1.2000 | | | |
| 844 | −147.2485CX | −77.8924CC | −22.2075 | 72.7262 | 50.6555 | Silica |
| Space | | | −3.2091 | | | |
| 846 | −159.2880CX | −519.4850CC | −13.8321 | 49.5648 | 39.0473 | Silica |
| Space | | | −0.2000 | | | |
| 848 | −129.3683CX | −426.7350CC | −6.1500 | 37.3816 | 32.4880 | Silica |
| Space | | Image Distance = | −4.0000 | | | |
| 850 | Image | Infinite | | | | |

The constants for the aspheric mirror 834 used in the equation located after Table 1 are as follows:

CURV=−0.00332614
K=0.000000
A=−4.32261E−10
B=3.50228E−14
C=7.13264E−19
D=2.73587E−22

This fourth embodiment is optimized for radiation centered on 248.4 nm. The single refracting material of fused silica and the large portion of refracting power restricts the spectral bandwidth of the embodiment depicted in FIG. 8. However, because the fourth embodiment has a maximum numerical aperture of 0.63 rather than of 0.7 as in the first three embodiments, the fourth embodiment provides acceptable imaging over a spectral full-width-half-maximum bandwidth of 300 picometers, or preferably of 100 picometers. Thus, in the former, an unnarrowed, or, in the latter, a narrowed excimer laser can be employed for the illumination source.

The fourth embodiment differs from the first three embodiments in that the net power of LG1 and LG2 of the fourth embodiment is weakly positive rather than weakly negative as in the first three embodiments. In addition, this illustrates that the overall focal power of LG1 plus LG2 can be either positive or negative and still permit an infinitely distant entrance pupil to be imaged at or near the concave mirror 834.

Figure 9:
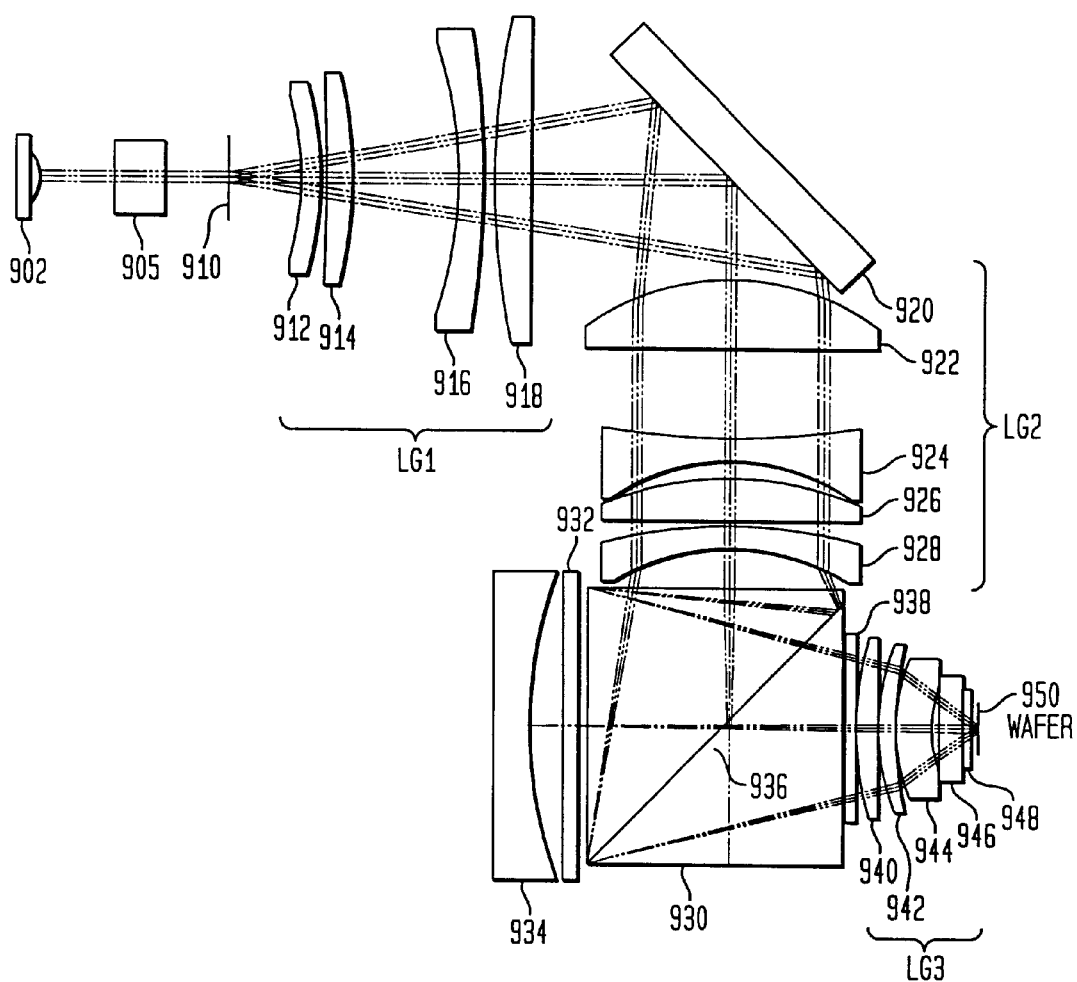
FIG. 9 is yet a further embodiment of the present invention.

FIG. 9 illustrates a fifth embodiment of the optical reduction system of the present invention. Preferably, this embodiment has a numerical aperture of 0.60 and operates at a spectral bandwidth of 300 picometers centered on 248.4 nanometers. From the long conjugate end, it includes a variable wave plate 905 within the illumination system, an object or reticle plane 110, a first lens group LG1, a folding mirror 920, a second lens group LG2, a beamsplitter cube 930, a first quarter-wave plate 932, a concave mirror 934, a second quarter-wave plate 938, and a third lens group LG3. The image is formed at an image or wafer plane 180.

The first lens group LG1 comprises a shell 912, a spaced doublet including a positive lens 914 and a negative lens 916, and a positive lens 918. The second lens group LG2 comprises a positive lens 922, a spaced doublet including a negative lens 924 and a positive lens 926, and a negative lens 928. The third lens group LG3 comprises two positive lenses 940 and 942, a shell 944, and two positive lenses 946 and 948. Again, as in the embodiment illustrated in FIG. 5, the folding mirror 920 of FIG. 9 is not essential to the operation of the invention, but nevertheless permits the object and image planes to be parallel to each other which is convenient for the manufacture of semiconductor devices using photolithography.

The construction data of the fifth embodiment illustrated in FIG. 9 is in Table 5 below.

TABLE 5

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 905 | Infinite | Infinite | 33.1000 | 123.0000 | 123.0000 | Quartz |
| Space | | | 1.1880 | | | |
| 910 | Infinite | | 62.7514 | | | |
| Space | | | 1.1880 | | | |
| 912 | −136.1154CC | −152.5295CX | 16.8300 | 120.7552 | 129.4354 | Silica |
| Space | | | 4.5206 | | | |
| 914 | −270.1396CC | −191.8742CX | 20.5341 | 132.9152 | 139.0377 | Silica |
| Space | | | 90.8476 | | | |
| 916 | −188.9000CC | −284.7476CX | 17.5000 | 156.1938 | 165.6567 | Silica |
| Space | | | 2.9700 | | | |
| 918 | 433.8174CX | −841.5599CX | 25.8293 | 173.8279 | 174.8334 | Silica |
| Space | | | 149.4549 | | | |
| | | Decenter(1) | | | | |
| 920 | Infinite | | −61.0000 | 177.2183 | | Reflection |
| 922 | −190.3251CX | −8413.4836CC | −34.4584 | 178.5071 | 174.2260 | Silica |
| Space | | | −51.5487 | | | |
| 924 | 690.5706CC | −146.4997CC | −11.8800 | 150.4109 | 141.8021 | Silica |
| Space | | | −10.6267 | | | |
| 526 | −265.9886CX | 1773.5314CX | −24.1851 | 142.1851 | 141.2400 | Silica |
| Space | | | −1.5000 | | | |
| 928 | −244.9899CX | −142.8558CC | −11.8800 | 139.3290 | 133.8967 | Silica |
| Space | | | −21.6411 | | | |
| 930 | Infinite | Infinite | −71.2800 | 134.3115 | 189.7826 | Silica |
| | | Decenter(2) | | | | |
| 936 | Infinite | | | 189.7826 | | Reflection |
| 930 | Infinite | Infinite | 71.2800 | 189.7826 | 189.7826 | Silica |
| Space | | | 1.9800 | | | |
| 932 | Infinite | Infinite | 5.9400 | 142.3429 | 142.6707 | Silica |
| Space | | | 18.5263 | | | |
| Stop | | | | 143.5034 | | |
| 934 | Aspheric | | −18.5263 | 143.5034 | | Reflection |
| 932 | Infinite | Infinite | −5.9400 | 134.2788 | 130.9398 | Silica |
| Space | | | −1.9800 | | | |
| 930 | Infinite | Infinite | −71.2800 | 130.1221 | 111.7247 | Silica |
| | | Decenter(3) | | | | |
| 930 | Infinite | Infinite | −60.4000 | 111.7247 | 96.1353 | Silica |
| Space | | | −1.9800 | | | |
| 938 | Infinite | Infinite | −4.4550 | 95.3562 | 94.2064 | Silica |
| Space | | | −1.1880 | | | |
| 940 | −127.4561CX | −1398.8019CC | −13.0104 | 90.4737 | 87.7002 | Silica |
| Space | | | −1.1880 | | | |
| 942 | −98.8795CX | −424.1302CC | −12.2874 | 80.7016 | 76.3270 | Silica |
| Space | | | −1.1880 | | | |
| 944 | −132.0104CX | −70.9574CC | −17.8706 | 71.0789 | 53.4306 | Silica |
| Space | | | −3.1246 | | | |
| 946 | −123.1071CX | −585.4471CC | −19.9496 | 52.6417 | 38.2256 | Silica |
| Space | | | −0.1980 | | | |
| 948 | −137.8349CX | −292.6179CX | −6.0885 | 36.7251 | 31.8484 | Silica |
| Space | Image Distance = | | −4.0000 | | | |
| 950 | Image | Infinite | | 26.5000 | | |

The constants for the aspheric mirror 934 used in the equation located after Table 1 are as follows:

CURV=−0.00325995

K=0.000000

A=−6.91799E−10

B=5.26952E−15

C=6.10046E−19

D=1.59429E−22

This fifth embodiment is optimized for radiation centered on 248.4 mn. The single refracting material of fused silica and the large portion of refracting power restricts the spectral bandwidth of the embodiment depicted in FIG. 9.

However, because the fifth embodiment has a maximum numerical aperture of 0.6 rather than of 0.7 as in the first three embodiments, the fifth embodiment provides acceptable imaging over a spectral full-width-half-maximum bandwidth of 300 picometers. Thus, an unnarrowed excimer laser can be employed for an illumination source. The fifth embodiment differs from the first three embodiments in that the net power of LG1 and LG2 of the fifth embodiment is weakly positive rather than weakly negative as in the first three embodiments. In addition, this illustrates that the overall focal power of LG1 plus LG2 can be either positive or negative and still permit an infinitely distant entrance pupil to be imaged at or near the concave mirror 934.

CONCLUSION

While specific embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An optical reduction system in a photolithographic tool, comprising:
    a reticle positioned along an axis of a light beam path between a source of the light beam and an objective lens group; and
    a polarization compensator positioned along the axis, adjacent the reticle and between the source of the light beam and the objective lens group, the polarization compensator providing a variable wavelength polarization difference that alters the light beam, which is used to project an image of the reticle onto the objective lens group.

2. The optical reduction system of claim 1, further comprising:
    a lens group having a negative power with an emerging numerical aperture, said emerging numerical aperture being larger than an object space numerical aperture;
    a beamsplitter that separates light incident from said lens group;
    a concave mirror; and
    another lens group having a positive power, wherein said polarization compensator alters the polarization of the light received by said lens group, the negative power of said lens group provides enough power to image an entrance pupil of the system at infinity to an aperture stop at or near said mirror, and the positive power of said another lens group provides substantially all of the power of the system and images the exit pupil of the system to infinity.

3. An optical reduction system comprising:
    a variable wave plate positioned along an axis of a light beam path between a source of the light beam and a first lens group, said first lens group having a positive power and an entering numerical aperture;
    a reticle positioned along the axis, adjacent the variable wave plate, said variable waveplate providing elliptically polarized light and said reticle providing linearly polarized light;
    a second lens group of negative power, said second lens group separated from said first lens group and having an emerging numerical aperture greater than the entering numerical aperture of said first lens group;
    a beamsplitter;
    a quarter-wave plate;
    a concave mirror; and
    a third lens group of positive power.

4. The optical reduction system as in claim 3 further comprising:
    said variable wave plate is a Berek's compensator.

5. The optical reduction system as in claim 3 wherein:
    said variable wave plate is a Soleil-Babinet compensator.

6. The optical reduction system as in claim 4 further comprising:
    a first quarter-wave plate placed between said beamsplitter and said concave mirror.

7. The optical reduction system as in claim 6 further comprising:
    a second quarter-wave plate placed between said beamsplitter and said third lens group.

8. The optical reduction system of claim 3, the positive power of said first lens group provides enough power to image an entrance pupil of the system at infinity through said second lens group to an aperture stop at or near said mirror, the negative power of said second lens group provides the necessary conjugates for said concave mirror, and the positive power of said third lens group provides the remainder of the total system power and images the exit pupil of the system to infinity.

* * * * *